United States Patent
Kurokawa et al.

(10) Patent No.: US 7,648,895 B2
(45) Date of Patent: Jan. 19, 2010

(54) VERTICAL CVD APPARATUS FOR FORMING SILICON-GERMANIUM FILM

(75) Inventors: Masaki Kurokawa, Tokyo (JP);
Katsuhiko Komori, Tokyo (JP);
Norifumi Kimura, Tokyo (JP);
Kazuhide Hasebe, Tokyo (JP);
Takehiko Fujita, Tokyo (JP); Akitake Tamura, Tokyo (JP); Yoshikazu Furusawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/341,642

(22) Filed: Dec. 22, 2008

(65) Prior Publication Data
US 2009/0104760 A1    Apr. 23, 2009

Related U.S. Application Data

(62) Division of application No. 10/965,789, filed on Oct. 18, 2004, now abandoned.

(30) Foreign Application Priority Data
Oct. 20, 2003    (JP)    ............................ 2003-359634

(51) Int. Cl.
H01L 21/00    (2006.01)
(52) U.S. Cl. .................. 438/505; 438/508; 438/488
(58) Field of Classification Search ......... 438/488–491, 438/503–509
See application file for complete search history.

(56) References Cited

U.S. PATENT DOCUMENTS

| 4,675,263 | A | 6/1987 | Saitoh et al. |
|---|---|---|---|
| 5,249,960 | A | 10/1993 | Monoe |
| 5,902,102 | A | 5/1999 | Nam et al. |
| 5,958,140 | A | 9/1999 | Arami et al. |
| 6,345,589 | B1 | 2/2002 | Ramiah et al. |
| 6,686,281 | B2 | 2/2004 | Yamazaki et al. |
| 2002/0011465 | A1 | 1/2002 | Yamamoto et al. |
| 2003/0111013 | A1 | 6/2003 | Oosterlaken et al. |
| 2003/0119288 | A1 | 6/2003 | Yamazaki et al. |
| 2004/0219735 | A1 | 11/2004 | Brabant et al. |
| 2005/0181586 | A1* | 8/2005 | Kurokawa et al. .......... 438/522 |

FOREIGN PATENT DOCUMENTS

| JP | 2-119126 | 5/1990 |
|---|---|---|
| JP | 2003/45811 | 2/2003 |
| JP | 2003-77845 | 3/2003 |
| JP | 2003-203872 | 7/2003 |
| KR | 2000-0026364 | 5/2000 |

* cited by examiner

*Primary Examiner*—Richard A. Booth
(74) *Attorney, Agent, or Firm*—Oblon, Spivak, McClelland, Maier & Neustadt, L.L.P.

(57) ABSTRACT

A vertical CVD apparatus is arranged to process a plurality of target substrates all together to form a silicon germanium film. The apparatus includes a reaction container having a process field configured to accommodate the target substrates, and a common supply system configured to supply a mixture gas into the process field. The mixture gas includes a first process gas of a silane family and a second process gas of a germane family. The common supply system includes a plurality of supply ports disposed at different heights.

14 Claims, 6 Drawing Sheets

VERTICAL CVD APPARATUS FOR FORMING SILICON-GERMANIUM FILM

CROSS-REFERENCE TO RELATED APPLICATIONS

The present application is a Divisional application of U.S. Ser. No. 10/965,789, filed Oct. 18, 2004, and is based upon and claims the benefit of priority from prior Japanese Patent Application No. 2003-359634, filed Oct. 20, 2003, the entire contents of which are incorporated herein by reference.

BACKGROUND OF THE INVENTION

1. Field of the Invention

The present invention relates to a vertical CVD apparatus and CVD method for processing a plurality of target substrates all together to form a silicon germanium film, and particularly relates to a technique used for semiconductor processes. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

Conventionally, for example, poly-silicon is used for gate electrodes of transistors. Gate electrodes of poly-silicon can be easily depleted, when supplied with a bias voltage. As the thickness of gate insulating films decreases, this becomes prominent, which is one of the causes of device properties being deteriorated. In order to solve this problem, it has been studied to employ silicon germanium, which has a higher dopant activation rate, in place of silicon. For example, Jpn. Pat. Appln. KOKAI Publication No. 2003-77845 (patent publication 1: see FIG. 1 and Paragraph 17) discloses a method for forming a silicon germanium film on the surface of a semiconductor wafer. This method employs a vertical heat-processing apparatus, which supplies mono-silane ($SiH_4$) gas and mono-germane ($GeH_4$) gas to form a silicon germanium film by CVD.

Figure 9:
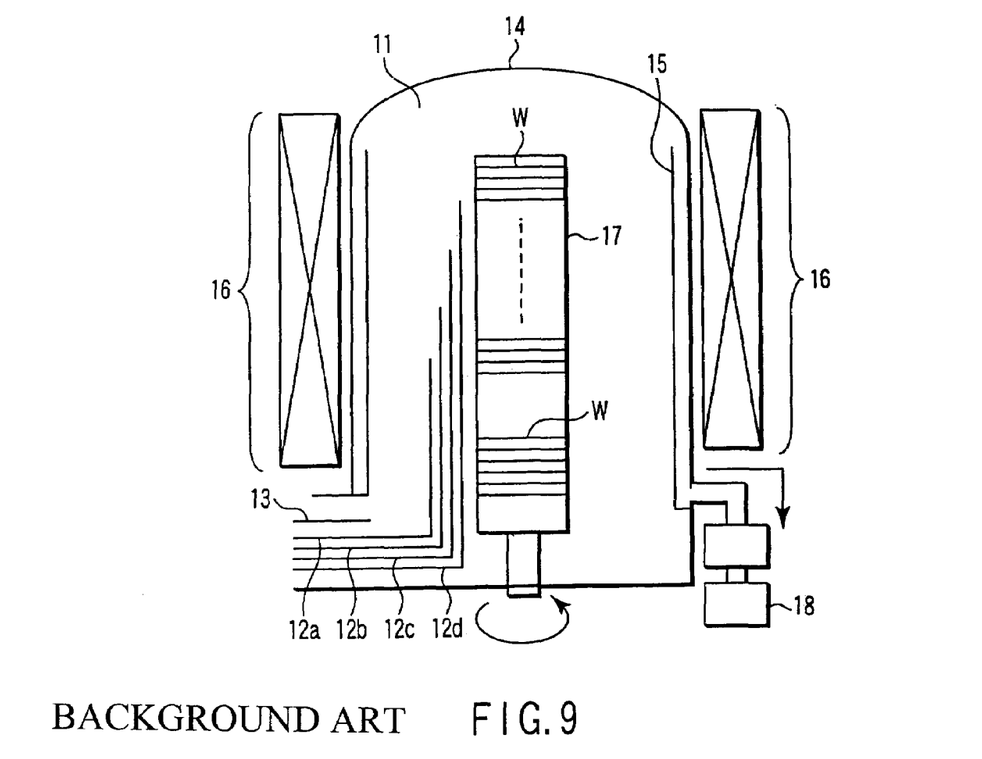
FIG. 9 is a view showing a conventional vertical CVD apparatus for forming a silicon germanium film.

FIG. 9 is a view showing a conventional vertical CVD apparatus for forming a silicon germanium film, disclosed in the patent publication 1. As shown in FIG. 9, this vertical heat-processing apparatus includes a reaction container 11 formed of an outer tube 14 and an inner tube 15. A wafer boat 17 for holding semiconductor wafers W is disposed in the reaction container 11. A heater 16 is disposed around the reaction container 11. The reaction container 11 is exhausted by an exhaust section 18.

Four injectors 12a to 12d with different lengths for supplying mono-germane are disposed beside the wafer boat 17 in the reaction container 11. An injector 13 is disposed at the bottom of the inner tube 15 for supplying a mixture gas prepared by mixing mono-silane and mono-germane. It should be noted that the patent publication 1 includes an error in FIG. 1, concerning the injectors 12a to 12d.

The source gases supplied from the injectors 12a to 12d and 13 flow upward within the inner tube 15, and then enter the gap between the inner tube 15 and outer tube 14 from the top and exhausted from the bottom. As compared to mono-silane and mono-germane with each other in decomposition reactivity, mono-germane is higher than mono-silane in decomposition reactivity, so mono-germane is consumed more. Accordingly, if only the injector 13 is used, the wafers end up having larger values in the thickness of a silicon germanium film and germanium concentration, as the position of the wafers is closer to the supply port of the injector 13. For this reason, this apparatus employs the four injectors 12a to 12d with different heights for supplying mono-germane to compensate for a shortfall of germanium on the downstream side.

BRIEF SUMMARY OF THE INVENTION

An object of the present invention is to provide a vertical CVD apparatus and CVD method, which allows a silicon germanium film formed to have high inter-substrate uniformity in the film thickness and germanium concentration.

According to a first aspect of the present invention, there is provided a vertical CVD apparatus for processing a plurality of target substrates all together to form a silicon germanium film, the apparatus comprising:

a reaction container having a process field configured to accommodate the target substrates;

a holder configured to hold the target substrates stacked at intervals within the reaction container;

a heater configured to heat the process field;

an exhaust system configured to exhaust the reaction container;

a common supply system including a plurality of supply ports disposed at different heights and configured to supply a mixture gas into the process field, the mixture gas comprising a first process gas of a silane family and a second process gas of a germane family;

a first gas supply circuit configured to supply the first process gas into the common supply system; and a second gas supply circuit configured to supply the second process gas into the common supply system.

According to a second aspect of the present invention, there is provided a vertical CVD method for processing a plurality of target substrates all together to form a silicon germanium film, the method comprising:

placing a holder in a process field within a reaction container, the holder holding the target substrates stacked at intervals; and forming a silicon germanium film by CVD on the target substrates within the process field, while setting the process field at a first temperature and a first pressure, and supplying a mixture gas into the process field through a plurality of supply ports disposed at different heights, the mixture gas comprising a first process gas of a silane family and a second process gas of a germane family.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems related to the conventional vertical CVD apparatus for forming a silicon germanium film shown in FIG. 9 (disclosed in the patent publication 1). As a result, the inventors have arrived at the findings given below.

According to the apparatus shown in FIG. 9, looking at two gas supply ports vertically adjacent to each other, mono-germane flowing out of the lower supply port is immediately decomposed at a higher decomposition rate, and thus a wafer closer to the lower supply port consumes a larger amount of mono-germane. As a consequent, the upper and lower wafers differ from each other in film thickness and germanium concentration, resulting in lower inter-substrate uniformity (between wafers).

In order to improve inter-wafer uniformity to attain a high yield, the intervals of supply ports have to be smaller, as the thickness of films used in semiconductor devices decreases. Accordingly, the apparatus shown in FIG. 9 needs to employ as many as four injectors (12$a$ to 12$d$) for mono-germane (five injectors 12$a$ to 12$d$, and 13, in total). In this case, with increase in the number of injectors, it is necessary to also respectively increase the number of supply devices for supplying process gases and mass-flow controllers for controlling gas flow rates, by that much. As a consequence, the apparatus cost increases, and so does the space necessary for installing many gas supply devices.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIRST EMBODIMENT

Figure 1:
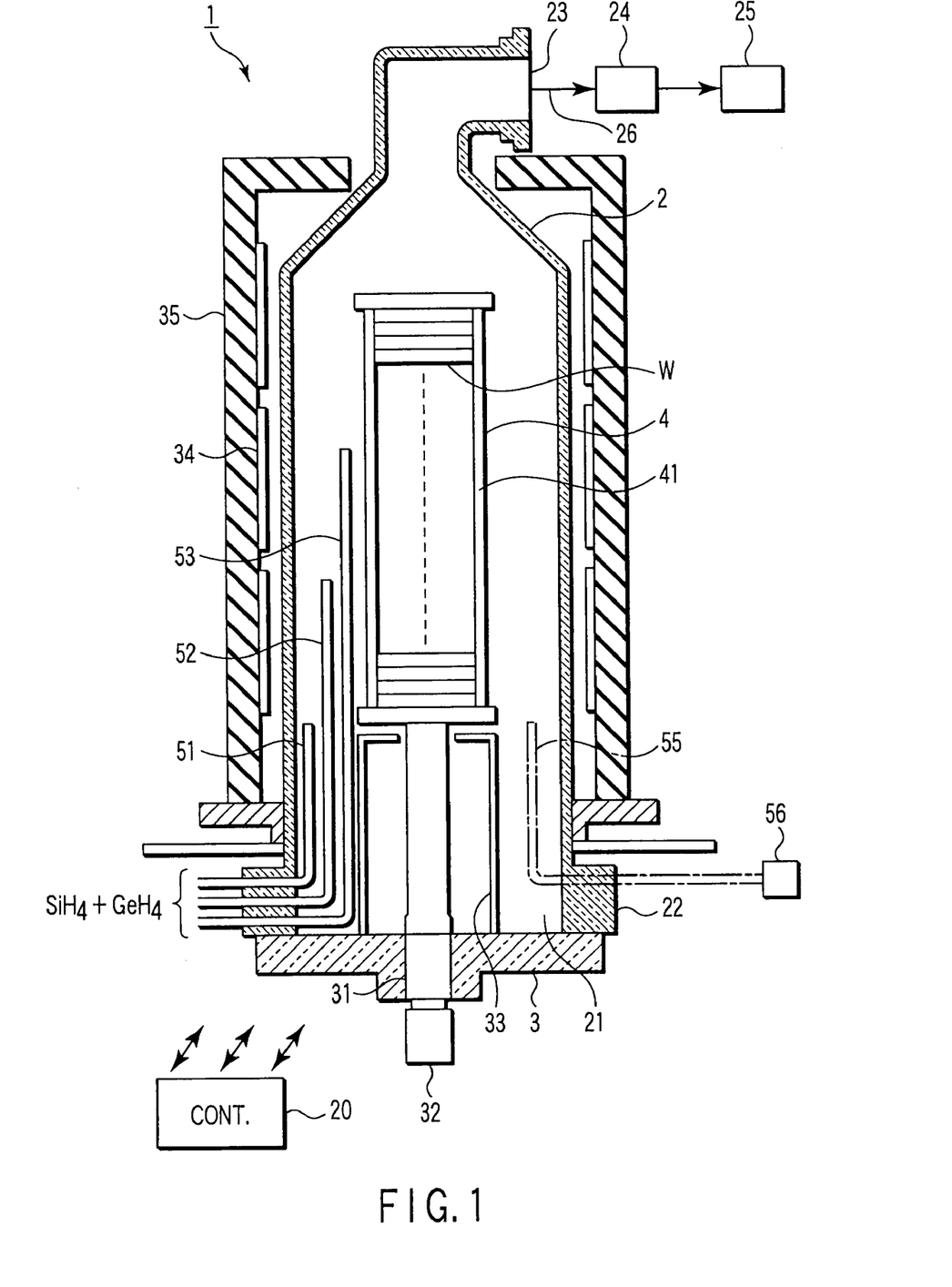
FIG. 1 is a structural view showing a vertical heat-processing apparatus according to a first embodiment of the present invention.
Figure 2:
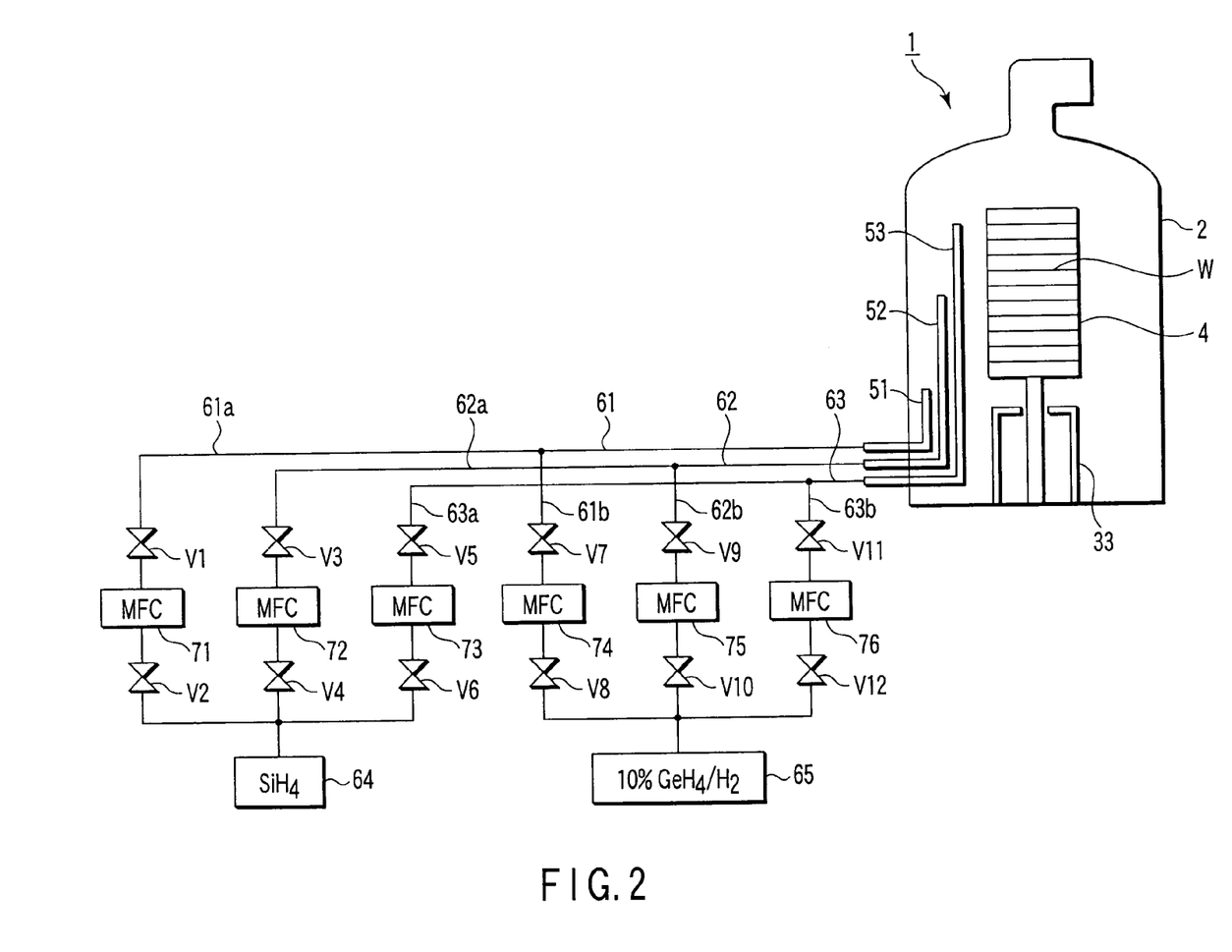
FIG. 2 is a piping diagram mainly showing the gas supply section of the apparatus shown in FIG. 1.

FIG. 1 is a structural view showing a vertical heat-processing apparatus according to a first embodiment of the present invention. FIG. 2 is a piping diagram mainly showing the gas supply section of the apparatus shown in FIG. 1. As shown in FIG. 1, the heat-processing apparatus (film-formation apparatus)$_1$ includes a cylindrical reaction container 2, which is made of, e.g., quartz and directed vertically. The reaction container 2 is opened at the bottom to form a load port 21, around which a flange 22 is integrally formed. A lid 3 made of, e.g., quartz is disposed below the reaction container 2, so that the lid 3 can come into contact with the bottom of the flange 22 to airtightly close the port 21. The lid 3 is moved up and down by a boat elevator (not shown) to open and close the port. A rotary shaft 31 extends through the center of the lid 3, and supports a substrate holder or wafer boat 4 at the top.

The wafer boat 4 includes three or more, e.g. four, struts 41. The struts 41 have grooves (slots) to support a plurality of, e.g., 125, target substrates or semiconductor wafers W stacked at intervals. The 125 wafers W consist of dummy wafers disposed at the top and bottom sides, and product wafers placed therebetween. The bottom of the rotary shaft 31 is connected to a motor 32 for rotating the rotary shaft 31, so that the wafer boat 4 is rotated by the motor 32. A heat-insulating unit 33 is disposed on the lid 3 and surrounds the rotary shaft 31.

First to third injectors 51 to 53 (constituting a common supply system) each having an L-shape are disposed equidistantly in the angular direction to extend through the flange 22 at the bottom of the reaction container 2, and are used to supply process gases onto the wafers W within the reaction container 2. The injectors 51 to 53 have different lengths, such that the gas supply ports at their distal end (tip openings) are positioned at different heights. The distal end of the shortest first injector 51 is positioned, e.g., near the bottom level of the range for holding wafers W in the wafer boat 4. The distal end of the middle-length second injector 52 is positioned, e.g., slightly below the central level of the range for holding wafers W in the wafer boat 4. The distal end of the longest third injector 53 is positioned, e.g., between the top level of the range for holding wafers W in the wafer boat 4 and the distal end of the second injector 52. The layout of the injectors 51 to 53 is not limited to that shown in FIG. 1, and their lengths are suitably set based on experimental results or the like. The injectors 51 to 53 are gathered in one area to be close to each other in the angular direction, so that maintenance can be easily performed. FIG. 1 shows the injectors to penetrate the flange 22 at different heights, but they penetrate the flange 22 side by side in the horizontal direction.

As shown in FIG. 2, the proximal ends of the injectors 51 to 53 are respectively connected to gas supply lines 61 to 63, i.e., gas supply passages. The proximal end of the gas supply line 61 is connected to gas supply lines 61$a$ and 61$b$. The proximal end of the gas supply line 62 is connected to gas supply lines 62$a$ and 62$b$. The proximal end of the gas supply line 63 is connected to gas supply lines 63$a$ and 63$b$. The gas supply lines 61$a$, 62$a$, and 63$a$ are connected to a supply source 64 of a silane family gas, such as mono-silane gas. The gas supply lines 61$b$, 62$b$, and 63$b$ are connected to a supply source 65 of a germane family gas, such as mono-germane gas. In this embodiment, the mono-germane gas is a gas diluted to 10% by hydrogen gas.

The gas supply lines 61$a$, 62$a$, and 63$a$ for supplying mono-silane gas are respectively provided with mass-flow controllers 71 to 73 used as flow rate regulators disposed thereon. The gas supply lines 61$b$, 62$b$, and 63$b$ for supplying mono-germane gas are respectively provided with mass-flow controllers 74 to 76 disposed thereon. The flow rates of mono-silane gas and mono-germane gas can be adjusted for each of the mixture gases supplied from the injectors 51 to 53, independently of each other. Symbols V1 to V12 denote valves.

An exhaust port 23 is formed at the top of the reaction container 2 to exhaust the interior of the reaction container 2. The exhaust port 23 is connected to an exhaust line 26 provided with a vacuum pump 25 and a pressure regulator 24 to vacuum-exhaust the interior of the reaction container 2 to a desired vacuum level. A furnace 35 is disposed around the reaction container 2, and includes a heater 34 for heating up the interior of the reaction container 2. The heater 34 is formed of a carbon wire heater, which allows a process to be performed with least contamination, i.e., at high cleanness, and allows temperature to be quickly increased and decreased.

Further, the film-formation apparatus 1 includes a control section 20 formed of a computer. The control section 20 is configured to activate a process program and read the description of a process recipe stored in a memory (not shown), so as to control the process conditions in accordance with the recipe. The control section 20 outputs control signals to respectively control the heater 34, pressure regulator 24, and gas supply devices (such as valves, mass-flow controllers, etc.) of the gas supply section.

Next, an explanation will be given of a film-formation method, performed in the film-formation apparatus 1 described above. First, a predetermined number of silicon wafers W are placed and stacked at intervals on a wafer boat 4, and the wafer boat 4 is then moved up by the boat elevator (not shown). With this operation, the wafer boat 4 is loaded into the reaction container 2, and the bottom port of the flange 22 is closed by the lid 3 (the state shown in FIG. 1).

Then, the process field within the reaction container 2, in which the wafer boat 4 is placed, is stabilized at a process temperature of, e.g., from 350 to 650° C. Then, mono-silane gas and mono-germane gas respectively fed from the supply sources 64 and 65 are mixed by the gas supply lines 61 to 63 and injectors 51 to 53, which are used as mixing means. Then, the mixture gases are respectively supplied from the distal end supply ports of the injectors 51 to 53, used as a common supply system, into the process field within the reaction container 2. Also, the interior of the reaction container is vacuum-exhausted through the exhaust line 26, and is adjusted to have a vacuum atmosphere of, e.g., from 10 to 130 Pa by the pressure regulator 24.

The injectors 51 to 53 are given different mixture ratios between the process gases, i.e., mono-silane gas and mono-germane gas. The mixture ratio at the injector 51 is set to be [mono-silane gas]/[mono-germane gas]=1200 sccm/600 sccm. The mixture ratio at the injector 52 is set to be [mono-silane gas]/[mono-germane gas]=300 sccm/190 sccm. The mixture ratio at the injector 53 is set to be [mono-silane gas]/[mono-germane gas]=300 sccm/220 sccm. In other words, according to this embodiment, the ratio of mono-silane gas relative to mono-germane gas in the mixture gas ([mono-silane gas]/[mono-germane gas]) is set to be lower as the position of the supply ports of the injectors is higher. It should be noted that, the mono-germane gas in this embodiment is a mono-germane gas diluted to 10% by hydrogen gas, as described above.

The mono-silane gas and mono-germane gas thus supplied react with each other by thermal decomposition in the process field, and a silicon germanium film is thereby formed on the surface of the wafers W. At this time, the wafer boat 4 is rotated by the motor 32. After the film-formation process is performed for a predetermined time, supply of the process gases is stopped, and the interior of the reaction container 2 is replaced with an inactive gas.

Then, the wafer boat 4 is unloaded from the reaction container 2, and is transferred to, e.g., an ion-implantation apparatus. A carrier impurity element, such as phosphorous (P) or boron (B), is implanted into the silicon germanium film. By doing so, a structure is formed in which the silicon germanium film is employed as a gate electrode.

According to the first embodiment, the following advantages can be obtained. Specifically, the activation energy of mono-germane is lower and thus the decomposition reactivity thereof is higher. If mono-germane is supplied solely from the bottom into the reaction container 2, less mono-germane is present at the upper part of the wafer boat 4. In this respect, the apparatus shown in FIG. 1 employs three injectors 51 to 53 with heights different from each other. As a consequence, mono-germane supplied from the injectors 52 and 53 compensates for a shortfall of mono-germane supplied from the lower injector 51.

Rather than being separately supplied from each other, mono-silane gas and mono-germane gas are mixed in advance, and supplied into the reaction container 2 thorough the injectors 51 to 53. When mono-germane is supplied into the process field, it has been diluted by mono-silane, which has a higher activation energy and thus a lower decomposition reactivity. In this case, a decomposition reaction of mono-germane is suppressed by mono-silane.

Looking at the respective parts between the distal end supply ports of the injectors 51 to 53, mono-germane in the mixture gas spouted from the supply port of the lower injector (51 or 52) is decomposed and consumed while it flows to the upper injector (52 or 53). However, since the decomposition reactivity of mono-germane is suppressed, although the lower wafer W still consumes mono-germane more than the upper wafer W does, the difference in consumption amount of mono-germane between lower and upper wafers W becomes smaller. As consequence, it is possible to attain high inter-substrate (between wafers W) uniformity in the film thickness of a silicon germanium film and germanium concentration, thereby improving the yield.

The number of injectors is not limited to three, and it may be two, or four or more. The number of injectors is set in accordance with the number of wafers W to be loaded (range for holding wafers W) or inter-substrate uniformity required.

As a comparative structure, there may be a structure in which mono-silane gas and mono-germane gas are separately supplied into a process field, wherein the mono-silane gas is from the bottom of the reaction container 2, and the mono-germane gas is from a plurality of injectors. As compared to this comparative structure, the structure of the first embodiment allows a high decomposition reactivity of mono-germane to be less influential, in terms of difference in film thickness and germanium concentration between upper and lower wafers. Specifically, if the same inter-substrate uniformity is to be attained, using the comparative structure and the structure of the first embodiment, the structure of the first embodiment requires a smaller number of injectors. In other words, the structure of the first embodiment requires a smaller number of gas line circuits, so the equipment cost and the installation space decrease.

Figure 8:
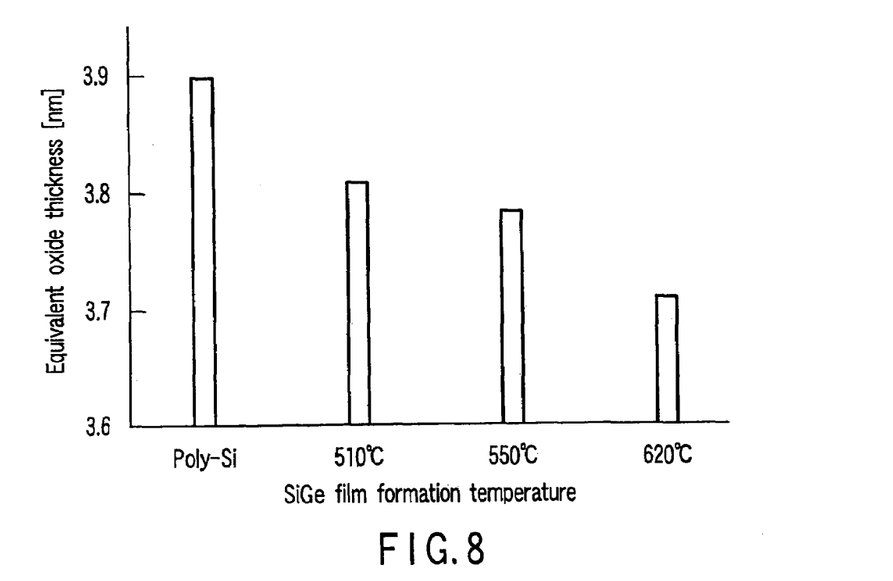
FIG. 8 is a graph showing the relationship between the film-formation temperature for a silicon germanium film and electrically equivalent film thickness thereof.

As shown in FIG. 8 described later, the properties of a silicon germanium film improve with higher process temperatures. However, since the decomposition reactivity of mono-germane also increases, as a consequence of the increased the process temperature, the process temperature should not be greatly increased, in practice. In the first embodiment, since mono-germane is diluted with mono-silane, the inter-substrate uniformity remains satisfactory, even where the process temperature is set at 350° C. or more, e.g., 540° C. In recent years, there is a tendency to use a higher process temperature, a larger wafer size, and a larger batch of wafers to be processed; for which the first embodiment is very effective. It should be noted that the process temperature is the temperature of the process field within the reaction container 2 for accommodating the wafer boat 4, and, more precisely, it is the set temperature at the center of an array of product wafers in the vertical direction.

SECOND EMBODIMENT

Figure 3:
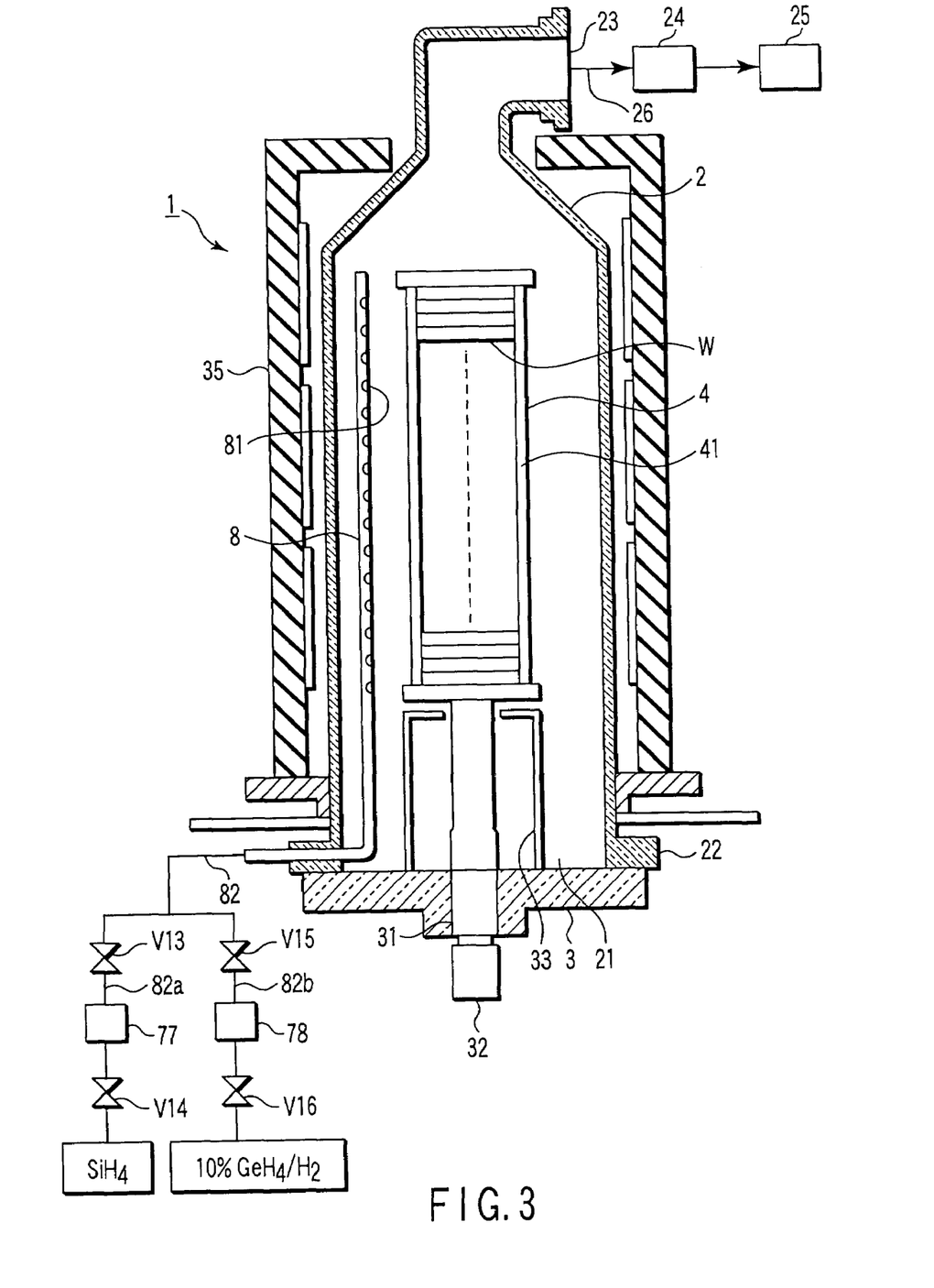
FIG. 3 is a structural view showing a vertical heat-processing apparatus according to a second embodiment of the present invention.

FIG. 3 is a structural view showing a vertical heat-processing apparatus according to a second embodiment of the present invention. In the first embodiment, a plurality of injectors with different lengths are disposed to supply the process gases (the mixture gas) into the process field from a plurality of positions along a direction in which wafers W are arrayed. On the other hand, in the second embodiment, a plurality of holes 81 are formed as gas supply ports in a pipe 8 (distribution type injector) along the longitudinal direction thereof, wherein the pipe 8 extends in the vertical direction within the reaction container 2, as shown in FIG. 3. For example, the holes (gas supply ports) 81 are opened in the pipe 8 at positions facing the wafer boat 4 and between each two adjacent wafers W. The supply ports 81 distribute a mixture gas of mono-silane gas and mono-germane gas into the process field. In this case, the hole size of the supply port 81 may be gradually increased in accordance with its height (i.e., on the downstream side), so that the process gases can be uniformly supplied in the vertical direction.

In the first and second embodiments, the silane family gas is not limited to mono-silane gas, and it may be a gas selected from the following materials: disilane ($Si_2H_6$), dichloro silane ($SiH_2Cl_2$), tetrachloro silane ($SiCl_4$), hexachloro silane ($Si_2Cl_6$), hexaethylamino disilane, hexamethyl disilazane, disilylamine, trisilylamine, and bistertialbutylamino silane. A silicon germanium film obtained by the method described above may be a poly-silicon germanium film or amorphous silicon germanium film. Mono-germane gas may be diluted or not diluted by hydrogen gas when used as mono-germane gas, as described above.

In the first embodiment, the silicon germanium film is supplied with a carrier impurity element by ion implantation to form a gate electrode. Alternatively, the silicon germanium film may be doped with phosphorous or boron by supplying a dopant gas, such as phosphine gas or boron trichloride, in film formation. In this case, as shown with a phantom line in FIG. 1, the reaction container 2 may be additionally provided with a dopant gas supply line or injector 55, which is connected to a dopant gas supply circuit 56. With this arrangement, a dopant gas is supplied from below the wafer boat 4.

EXPERIMENT

Present Example 1

Using the film-formation apparatus 1 shown in FIG. 1, a silicon germanium film was formed on the surface of silicon wafers W. The supply ports of injectors 51 to 53 are set at heights corresponding to slot numbers "82", "46", and "20" of a wafer boat 4. The slot numbers denote slot positions of the wafer boat, in which a slot position is located on a lower side as its number symbol is higher. The process conditions for the silicon germanium film were set, as follows.
  Set temperature: 540° C.
  Set pressure: 47 Pa.
  Flow rate ratios ([mono-silane gas]/[mono-germane gas]) at the injectors:
    First injector 51: 1200 sccm/600 sccm,
    Second injector 52: 300 sccm/190 sccm,
    Third injector 53: 300 sccm/200 sccm.

The mono-germane gas used was a gas diluted to 10% by hydrogen gas.

In the present example 1, the wafers with a silicon germanium film formed thereon were unloaded, and the thickness of the silicon germanium film and planar uniformity and inter-substrate uniformity thereof were measured. Further, the germanium concentration in the silicon germanium film and planar uniformity and inter-substrate uniformity thereof were measured.

Figure 4:
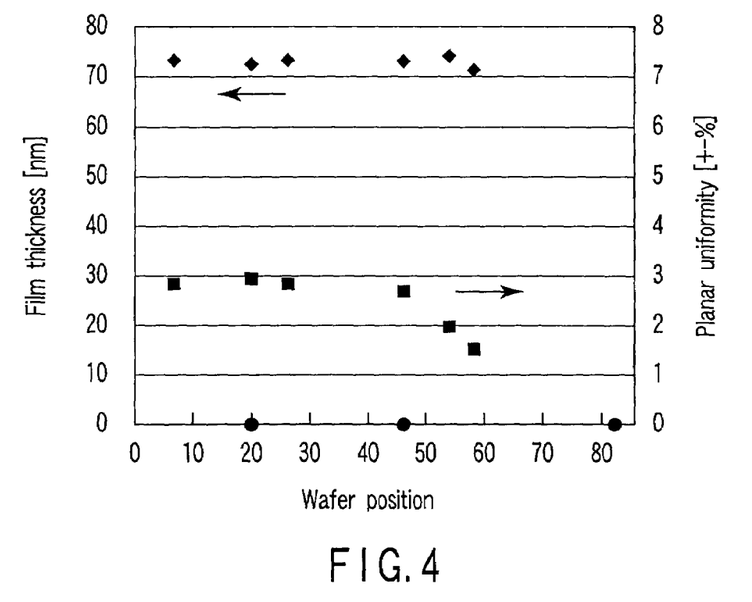
FIG. 4 is a graph showing the relationship of the film thickness of a silicon germanium film and planar uniformity thereof relative to wafer position, in a present example 1.

FIG. 4 is a graph showing the relationship of the film thickness of a silicon germanium film and planar uniformity thereof relative to wafer position, in the present example 1. In FIG. 4, the horizontal axis denotes numbers of slot positions of the wafer boat 4, in which a slot position is located on a lower side as its number symbol is higher. The vertical axis denotes the film thickness (nm) of a silicon germanium film and planar uniformity (±%) of the film thickness. In the graph shown in FIG. 4, "♦" denotes a measurement of film thickness (the average value from nine points on the plane), and "■" denotes the planar uniformity thereof.

Figure 5:
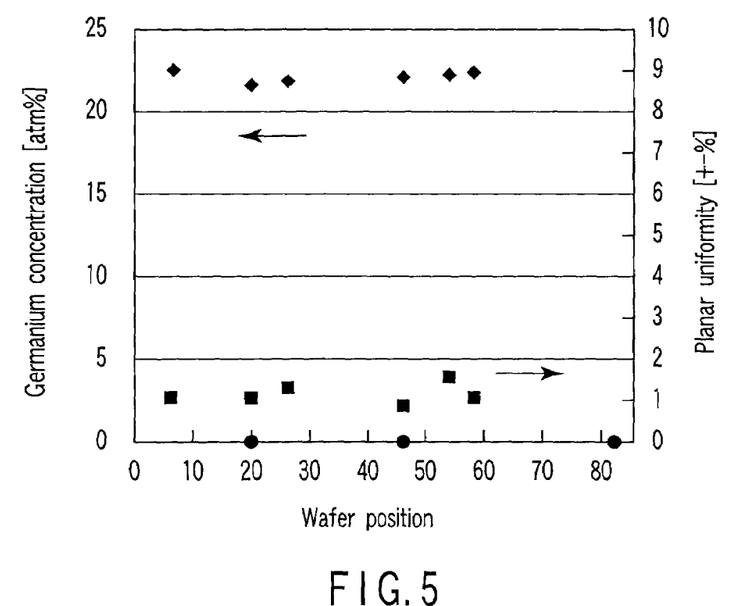
FIG. 5 is a graph showing the relationship of the germanium concentration in a silicon germanium film and planar uniformity thereof relative to wafer position, in the present example 1.

FIG. 5 is a graph showing the relationship of the germanium concentration in a silicon germanium film and planar uniformity thereof relative to wafer position, in the present example 1. In FIG. 5, the horizontal axis denotes slot positions (slot numbers) of the wafer boat 4. The vertical axis denotes the germanium concentration (atm %) in a silicon germanium film and planar uniformity (±%) thereof. In the graph shown in FIG. 5, "♦" denotes a measurement of germanium concentration in the film (the average value from five points on the plane), and "■" denotes the planar uniformity thereof. Further, "●" denotes a gas spouting position.

As shown in FIG. 4, the measured film thickness of the silicon germanium film on the wafers W was within a range of from 70 to 75 nm. The planar uniformity of the film thickness was within a range of from ±1.5% to ±3%, and the inter-substrate uniformity of the film thickness was ±1.27%. The planar uniformity and inter-substrate uniformity are expressed by the following formulas.

$$\text{Planar uniformity} = \{(T\max - T\min)/2X\} \times 100 (\%)$$

Where Tmax is the maximum value among measurement points, Tmin is the minimum value among measurement points, and X is the average value of measured values (of the film thickness or concentration).

$$\text{Inter-substrate uniformity} = \{(K\max - K\min)/2Y\} \times 100 (\%)$$

Where Kmax is the maximum value among the average values of the film thickness or concentration on all the monitor wafers, Kmin is the minimum value among the average values of the film thickness or concentration on all the monitor wafers, and Y is the average value from all the wafers in terms of the average values on the respective wafers.

As shown in FIG. 5, the measured germanium concentration in the silicon germanium film on the wafers W was within a range of from 21 to 23 atm %. The planar uniformity of the germanium concentration was within a range of from ±1% to ±2%, and the inter-substrate uniformity of the germanium concentration was ±2.18%.

Comparative Example 1

A silicon germanium film was formed in the same manner as the present example 1, except that only one injector was disposed in the reaction container 2. The supply port of the injector was set at a height slightly lower than the lowest level (slot number 125) of the wafer boat 4. Under these conditions, wafers W were subjected to the film-formation process in the comparative example 1.

Comparative Example 2

A silicon germanium film was formed on wafers W in the same manner as the present example 1, except that two injectors having supply ports at the same height were disposed in the reaction container 2, and used to separately supply mono-silane gas and mono-germane gas into the process field.

Then, for the wafers according to the comparative examples 1 and 2, the film thickness of the silicon germanium film and planar uniformity and inter-substrate uniformity thereof were measured. Further, the germanium concentration in the silicon germanium film and planar uniformity and inter-substrate uniformity thereof were measured.

Figure 6:
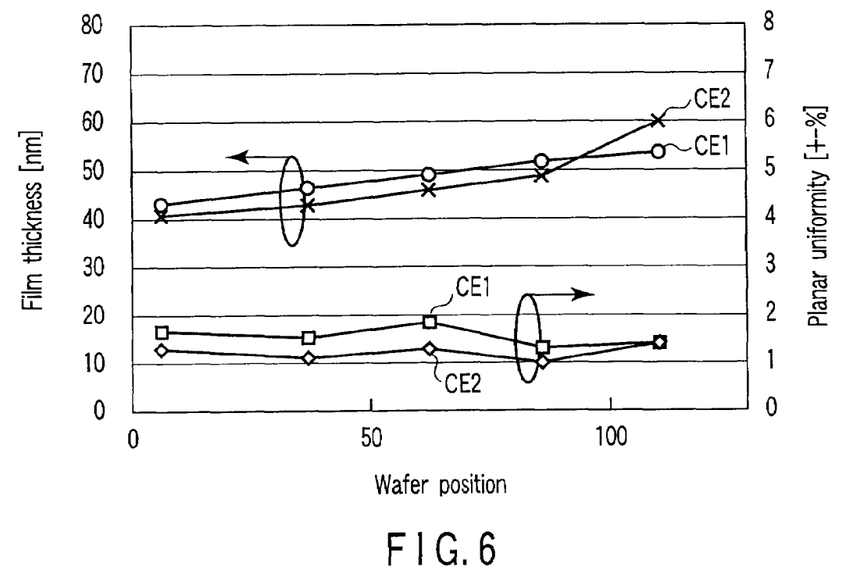
FIG. 6 is a graph showing the relationship of the film thickness of a silicon germanium film and planar uniformity thereof relative to wafer position, in a comparative example 1 and a comparative example 2.

FIG. 6 is a graph showing the relationship of the film thickness of a silicon germanium film and planar uniformity thereof relative to wafer position, in the comparative example 1 (CE1) and comparative example (CE2). In FIG. 6, the horizontal axis denotes slot positions (slot numbers) of the wafer boat 4. The vertical axis denotes the film thickness (nm) of a silicon germanium film and planar uniformity (±%) of the film thickness. In the graph shown in FIG. 6, "○" and "x" denote a film thickness (the average value from nine points on the plane) on the comparative examples 1 and 2, respectively, and "□" and "◇" denote the planar uniformity of the film thickness on the comparative examples 1 and 2, respectively.

Figure 7:
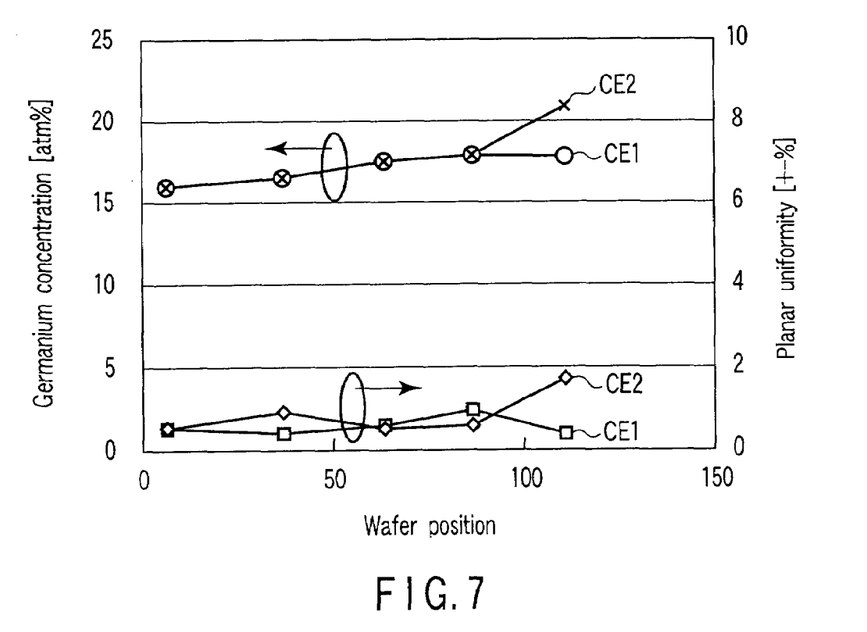
FIG. 7 is a graph showing the relationship of the germanium concentration in a silicon germanium film and planar uniformity thereof relative to wafer position, in the comparative example 1 and comparative example 2.

FIG. 7 is a graph showing the relationship of the germanium concentration in a silicon germanium film and planar uniformity thereof relative to wafer position, in the comparative example 1 (CE1) and comparative example (CE2). In FIG. 7, the horizontal axis denotes slot positions (slot numbers) of the wafer boat 4. The vertical axis denotes the germanium concentration (atm %) in a silicon germanium film and planar uniformity (±%) thereof. In the graph shown in FIG. 7, "○" and "x" denote a germanium concentration (the average value from four points on the plane) in the comparative examples 1 and 2, respectively, and "□" and "◇" denote the planar uniformity of the germanium concentration in the comparative examples 1 and 2, respectively.

As shown in FIG. 6, the measured film thickness of the silicon germanium on the wafers W was within a range of from 40 to 55 nm in the comparative example 1 (CE1), and it was within a range of from 40 to 60 nm in the comparative example 2 (CE2). The planar uniformity of the film thickness was within a range of from +1.2% to ±2% in the comparative example 1, and it was within a range of from ±1.2% to ±1.5% in the comparative example 2. The inter-substrate uniformity of the film thickness was +10.34% in the comparative example 1, and it was ±19.89% in the comparative example 2.

As shown in FIG. 7, the measured germanium concentration in the silicon germanium on the wafers W was within a range of from 15 to 18 atm % in the comparative example 1 (CE1), and it was within a range of from 15 to 22 atm % in the comparative example 2 (CE2). The planar uniformity of the germanium concentration was within a range of from +0.5% to +10 in the comparative example 1, and it was within a range of from ±0.5% to ±2% in the comparative example 2. The inter-substrate uniformity of the germanium concentration was ±7.746 in the comparative example 1, and it was ±15.14% in the comparative example 2.

As compared to the present example 1, the comparative example 1 was slightly better in the planar uniformity of the film thickness and germanium concentration, but it was remarkably worse in the inter-substrate uniformity thereof. Since the present example 1 was far better in the inter-substrate uniformity, it has been confirmed that disposing a plurality of injectors to compensate for a shortfall of gas from the upstream side is effective.

As compared to the comparative example 1, the comparative example 2, in which mono-germane gas and mono-silane gas were separately supplied into the reaction container 2, was worse in the planar uniformity. This was so because the film thickness and germanium concentration were locally very high on the upstream side (near the bottom of the wafer boat 4). Specifically, where mono-germane gas is separately supplied into the process field, mono-germane gas supplied from an injector is less diluted, immediately after it is supplied, by mono-silane gas supplied from another injector, and thus the consumption amount of mono-germane is high. As the mono-germane gas flows upward, it is mixed with the mono-silane gas and the consumption amount is stabilized. It is thought that this mechanism brought about the result shown in FIG. 6. Accordingly, it has been confirmed that supplying a mixture of mono-germane gas and mono-silane gas is highly advantageous.

Present Example 2

A gate insulating film was formed to be 3 mm on a silicon substrate, and a silicon germanium film was then formed in the same manner as the present example 1, except that the process temperature was set at 510° C., 550° C., or 620° C. Then, the electrically equivalent film thickness of the silicon germanium film was determined.

FIG. 8 is a graph showing the relationship between the film-formation temperature for a silicon germanium film and electrically equivalent film thickness thereof. FIG. 8 also shows the electrically equivalent film thickness of a polysilicon film. As shown in FIG. 8, with increase in the film-formation temperature, the electrically equivalent film thickness became smaller. A smaller value of the electrically equivalent film thickness means that depletion of a gate can be more suppressed when a transistor is turned on.

As described above, the film-formation temperature for silicon germanium is preferably set at, e.g., 350° C. or more. Accordingly, for the film quality of a transistor, a higher temperature is preferably used. According to the first and second embodiments, even where the film-formation temperature is higher and decomposition of mono-germane is accelerated, a high inter-substrate uniformity in the film thickness and germanium concentration can be maintained. As a consequence, the embodiments are very effective techniques for use in manufacturing semiconductor devices that employ silicon germanium.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical CVD method for processing a plurality of target substrates all together to form a silicon germanium film, the method comprising:

placing a holder in a process field within a reaction container, the holder holding the target substrates stacked at intervals; and forming a silicon germanium film by CVD on the target substrates within the process field, while setting the process field at a first temperature and a first pressure, and supplying a first process gas of a silane family and a second process gas of a germane family into the process field, wherein said forming a silicon germanium film comprises preparing a plurality of mixture gases with different ratios of the first process gas relative to the second process gas by mixing the first and second process gases, supplying the plurality of mixture gases into the process field respectively through a plurality of supply ports disposed at different heights inside the reaction container such that the ratios of the plurality of mixture gases are lower as the supply ports are high in position, and exhausting gas upward from the process field.

2. The method according to claim 1, wherein said forming a silicon germanium film is arranged such that the first temperature is set to be within a range of from 350 to 650° C. and the first pressure is set to be within a range of from 10 to 130 Pa.

3. The method according to claim 1, wherein said exhausting gas upward from the process field is performed by use of an exhaust port disposed at a top of the reaction container.

4. The method according to claim 1, wherein said forming a silicon germanium film further comprises supplying a dopant gas into the process field, the dopant gas being used for doping the silicon germanium film with a carrier impurity.

5. The method according to claim 1, wherein the first process gas is mono-silane ($SiH_4$) gas and the second process gas is mono-germane ($GeH_4$) gas.

6. The method according to claim 1, wherein the plurality of supply ports comprise first, second, and third supply ports such that the second supply port is located above the first supply port and the third supply port is located above the second supply port, the plurality of mixture gases comprise first, second, and third mixture gases respectively with first, second, and third ratios of the first process gas relative to the second process gas such that the second ratio is lower than the first ratio and the third ratio is lower than the second ratio, and said forming a silicon germanium film is arranged to supply first, second, and third mixture gases respectively through the first, second, and third supply ports.

7. A vertical CVD method for processing a plurality of target substrates all together to form a silicon germanium film in a vertical CVD apparatus, the apparatus comprising:

a reaction container having a process field configured to accommodate the target substrates;

a holder configured to hold the target substrates stacked at intervals within the reaction container;

a heater configured to heat the process field;

an exhaust system configured to exhaust the reaction container such that gas flows upward inside the process field;

a gas supply system configured to supply a first process gas of a silane family and a second process gas of a germane family into the process field, the gas supply system including a plurality of supply ports disposed at different heights inside the reaction container; and a control section configured to control an operation of the apparatus, the method comprising:

placing the holder in the process field within the reaction container, the holder holding the target substrates stacked at intervals; and forming a silicon germanium film by CVD on the target substrates within the process field, while setting the process field at a first temperature and a first pressure, and supplying the first and second process gases into the process field, wherein said forming a silicon germanium film is performed under control of the control section and comprises preparing a plurality of mixture gases with different ratios of the first process gas relative to the second process gas by mixing the first and second process gases, supplying the plurality of mixture gases into the process field respectively through the plurality of supply ports such that the ratios of the plurality of mixture gases are lower as the supply ports are higher in position, and exhausting gas upward from the process field.

8. The method according to claim 7, wherein the gas supply system comprises a plurality of injectors inserted into the reaction container and respectively having the plurality of supply ports.

9. The method according to claim 8, wherein the gas supply system comprises a first gas supply circuit configured to supply the first process gas and including branch lines respectively connected to the plurality of injectors, and a second gas supply circuit configured to supply the second process gas and including branch lines respectively connected to the plurality of injectors, the branch lines of the first and second supply circuits being respectively provided with flow rate regulators, and said forming a silicon germanium film comprises adjusting the flow rate regulators to set the ratios of the plurality of mixture gases under control of the control section.

10. The method according to claim 7, wherein said forming a silicon germanium film is arranged such that the first temperature is set to be within a range of from 350 to 650° C. and the first pressure is set to be within a range of from 10 to 130 Pa.

11. The method according to claim 7, wherein said exhausting gas upward from the process field is performed by use of an exhaust port disposed at a top of the reaction container.

12. The method according to claim 7, wherein said forming a silicon germanium film further comprises supplying a dopant gas into the process field, the dopant gas being used for doping the silicon germanium film with a carrier impurity.

13. The method according to claim 7, wherein the first process gas is a mono-silane ($SiH_4$) gas and the second process gas is mono-germane ($GeH_4$) gas.

14. The method according to claim 7, wherein the plurality of supply ports comprise first, second, and third supply ports such that the second supply port is located above the first supply port and the third supply port is located above the second supply port, the plurality of mixture gases comprise first, second, and third mixture gases respectively with first, second, and third ratios of the first process gas relative to the second process gas such that the second ratio is lower than the first ratio and the third ratio is lower than the second ratio, and said forming a silicon germanium film is arranged to supply first, second, and third mixture gases respectively through the first, second, and third supply ports.

* * * * *